United States Patent [19]

Tsai

[11] Patent Number: 5,443,591
[45] Date of Patent: Aug. 22, 1995

[54] CONNECTOR SOCKET

[76] Inventor: Tien C. Tsai, No. 28, Wu-Chuan 8 Rd., Wu-Ku Hsiang, Taipei Hsien, Taiwan

[21] Appl. No.: 248,035

[22] Filed: May 24, 1994

[51] Int. Cl.⁶ .......................................... H01R 13/629
[52] U.S. Cl. .................................................... 439/342
[58] Field of Search ........................ 439/259, 261–265, 439/267, 342

[56] References Cited

U.S. PATENT DOCUMENTS

| | | | |
|---|---|---|---|
| 4,498,725 | 2/1985 | Bright et al. | 439/342 |
| 4,988,310 | 1/1991 | Bright et al. | 439/342 |

*Primary Examiner*—Gary F. Paumen
*Attorney, Agent, or Firm*—Pro-Techtor International

[57] ABSTRACT

A connector socket has a two-side contact structure and allows vertical or lateral inserting connection with an electronic device. The base frame has a plurality of receptacles each has two indented lateral surfaces. A rack of contact elements is formed with a stamping strip in an integral piece and each contact element has curved surfaces on its two contact beams which are generally equal height. A holding bulge with a dome shape groove therein is disposed under one end of the socket cover to house an ecentric shaft of an operating lever. Both socket cover and base frame have opennings or recesses on their lateral sides to allow a disengaging means to enter to make a quick removal of the socket cover from the base frame.

3 Claims, 12 Drawing Sheets

CONNECTOR SOCKET

FIELD OF THE INVENTION

The present invention relates to a connector socket for connecting an electronic device with another electronic device or electrical power source.

BACKGROUND OF THE INVENTION

The present invention is directed toward connector sockets and the like. These connector sockets typically allow a user to connect an electronic devices either vertically or laterally depend on the shape and number of the limbs of an electronic device.

Lateral connection is usually used for a device with a large number of round shape pins, while vertical connection is employed for a device with relatively small number of flat type limbs. Furthermore the conductive contact between a conventional connector socket and a limb of an electronic device is either two sides or one side. A socket with two-side contact is more reliable, however it needs almost twice the amount of conductive contact material comparing with that of one-side contact. The one-side contact socket needs less materials and assembly time, however it is less reliable and demands more precise matching socket components. More about the shortcomings and constraints of these two types of contact method is set forth below.

Taking an example from U.S. Pat. No. 4,498,725 and referring to FIG. 1 and 2. The reference example is a two-side contact connector. It takes almost twice the amount of conductive contact material than that of a one-sided contact connector. Furthermore, the stamping strip connects the limbs of the contact element at the lower end. The contact elements cannot be installed into connector socket by a rack at a time. It is time-consuming to install all contact elements into a connector socket. The solution to this problem of trying to allow two-side contact and to install a plurality of contact elements at a time in the prior art was to make the distance between two limbs of contact elements twice of that between two socket receptacles (i.e. 0.2 inch between two contact elements and 0.1 inch between two socket receptcles). It usually takes two installation processes to place the needed contact elements in a row of socket receptcles. The structure of the connector socket components is complicated, and the process requires great efforts and skills and is time-consuming.

Taking another example from U.S. Pat. No. 4,988,310 and referring to FIG. 3. It is a one-sided contact connector. Although it reduces the material usage by almost one half comparing with that of a two-side contact connector, it is less reliable. The matching socket components also need greater precision and consequently cost more. A one-sided contact connector also tends to lose its spring strength after a long period of use and usually can only allow lateral inserting of an electronic device. The limbs of one-side contact connector also easily get damaged when connecting an electronic device unless a proper tool is used and strict procedures are followed.

Thus there has been found much need for improvement in the structure and process of a connector socket.

SUMMARY OF THE INVENTION

It is accordingly an object of the present invention to provide an improved structure for a connector socket wherein two-side conductive contact is obtained while using contact material of that of one-side conductive contact, and one set of contact elements can be installed at a time into one row of socket receptacles, and allows either vertical or lateral connection with an electronic device.

It is contemplated in connection with the object set forth above that lateral connection be adopted for an electronic device having a large number of round connecting pins, and vertical connection be adopted for an electronic device having a relative small number of flat connecting limbs.

It is another object of the present invention to provide an improved means to facilitate the connection of an electronic device with a connector socket, and to allow quick and simple test of the connection being made, and consequently to improve connection quality.

It is also contemplated in connection with the object set forth above to provide an improved engaging mechanism wherein two holding bulges each with a dome shape groove therein are disposed on a base frame and one on a socket cover of the connector socket, and an operating lever is provided with an ecentric shaft engaging with a bush to make socket cover of the connector socket moving in the desired direction.

It is yet another object of the present invention to provide a disengaging means to allow quick separation of the socket cover from the base frame of the connector socket.

Additional objects and advantages of the present invention are made apparent in the following description having referance to the accompanying drawings. The accompanying drawings are only to serve for reference and illustrative purpose, and do not intend to limit the scope of the present invention.

DESCRIPTION OF THE PREFERRED EMBODIMENTS

Figure 1:
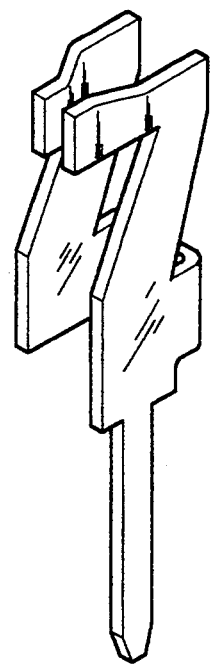
FIG. 1 is a perspective view of a conventional connector with two-side contact.
Figure 2:
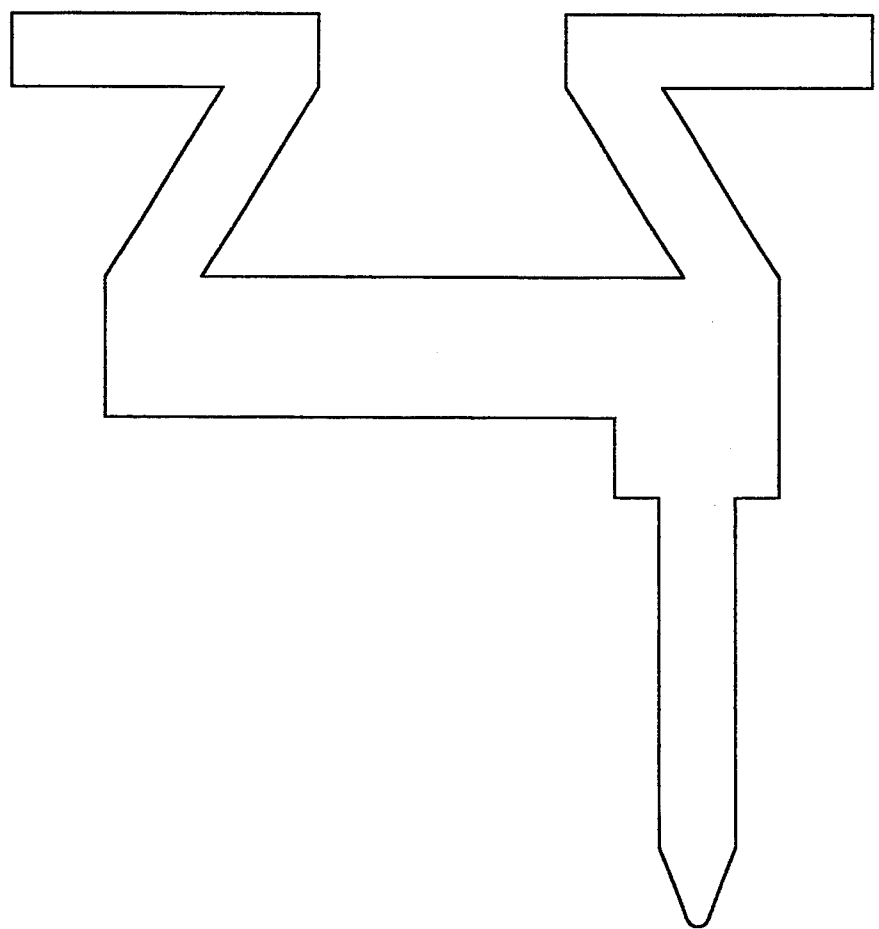
FIG. 2 is a plan view of a conventional connector illustrated in FIG. 1 after being flattened.
Figure 3:
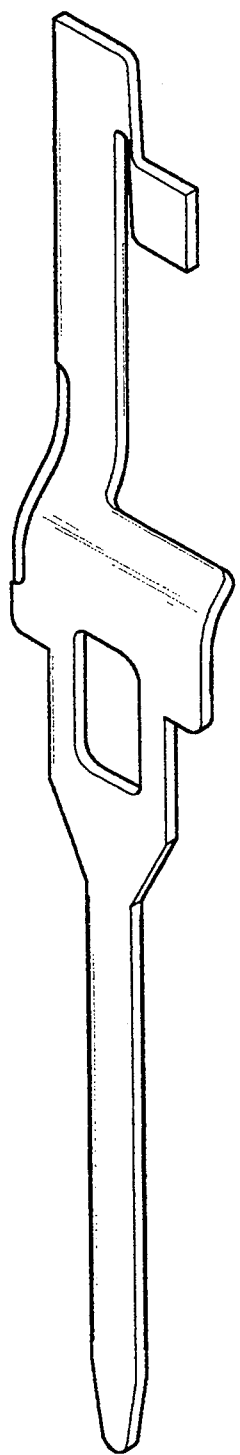
FIG. 3 is a perspective view of a conventional connector with one-side contact.
Figure 4:
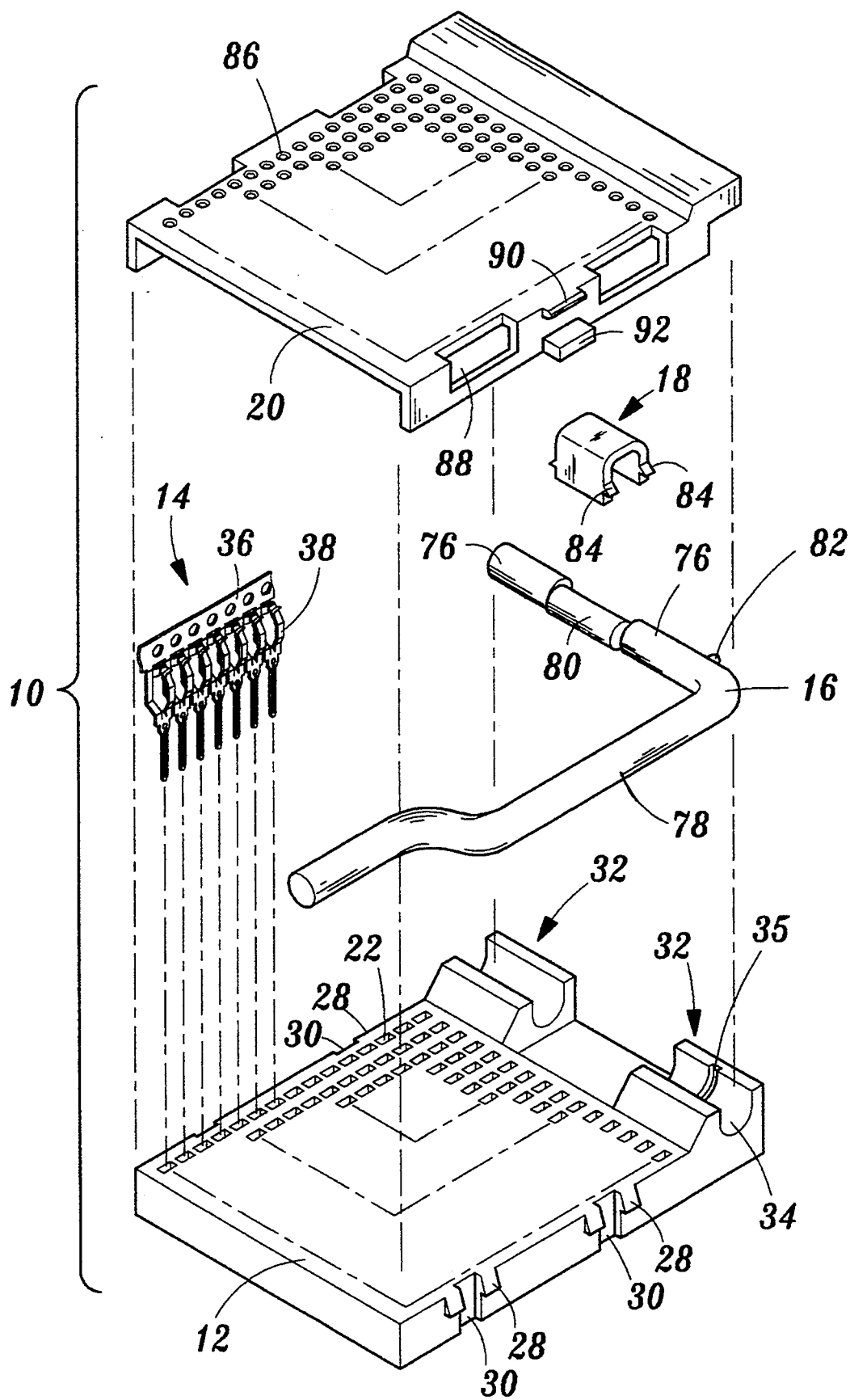
FIG. 4 is a break-up view of a preferred embodiment of the present invention.

Referring to FIG. 4 for the overall structure and features of the present invention. A connector socket 10 comprises a base frame 12, racks of contact elements 14, an operating lever 16, a bush 18 and a movable socket cover 20, wherein a plurality of receptacles 22 are disposed on base frame 12 to receive and accommodate racks of contact elements 14.

Figure 8:
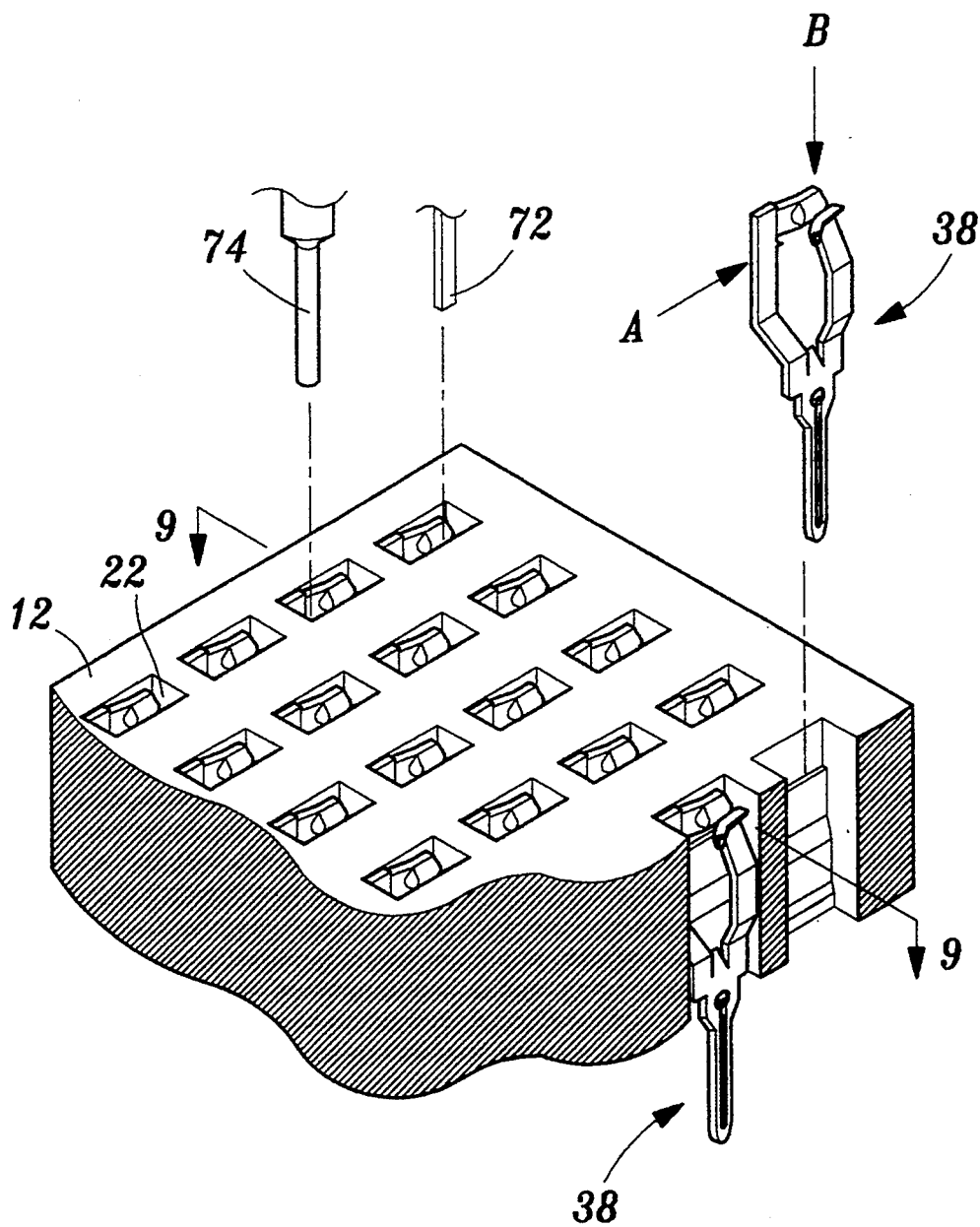
FIG. 8 is a fragmentary cutaway view of a base frame of the present invention.
Figure 9:
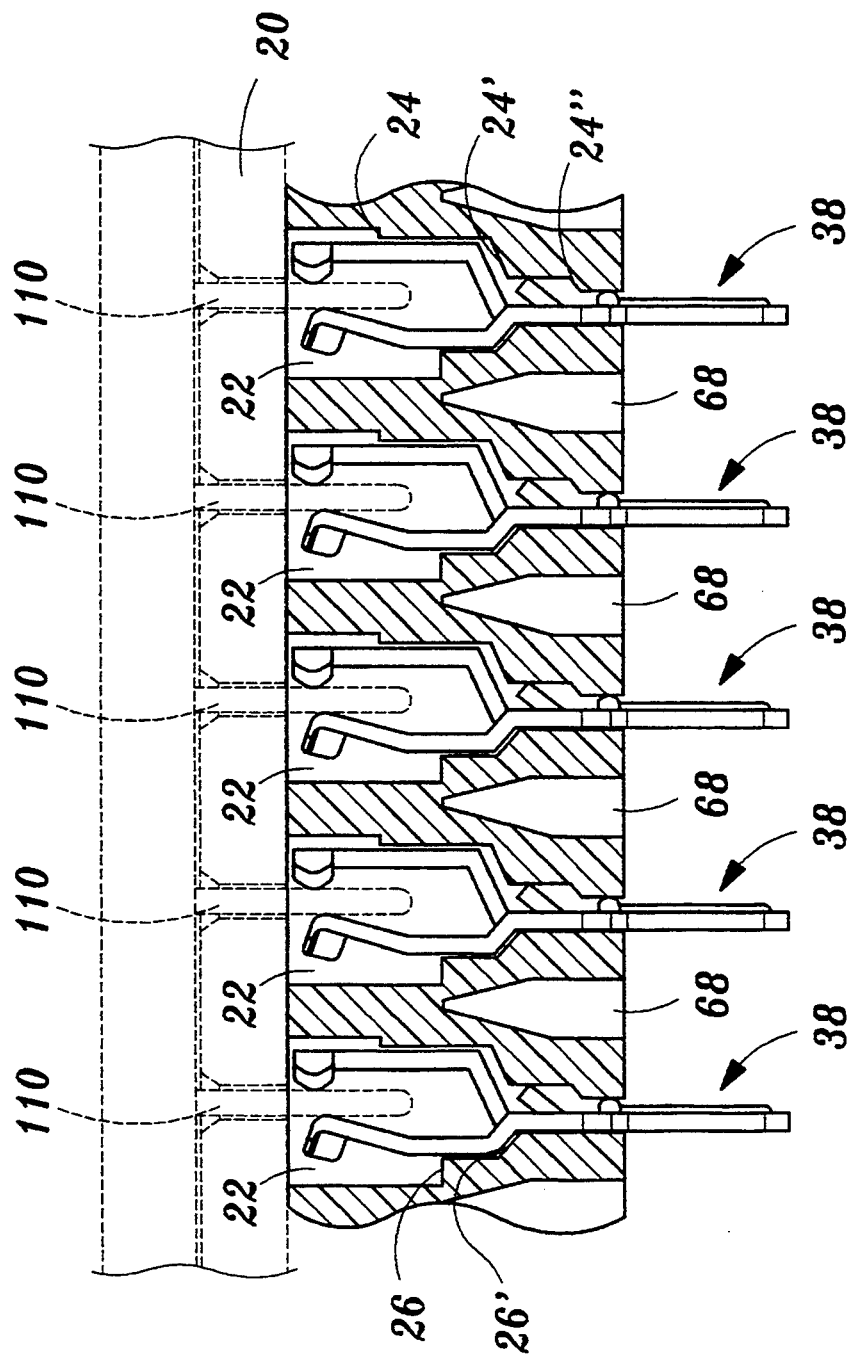
FIG. 9 is a fragmentary section view of a base frame of the present invention taken in section along section lines 9—9 of FIG. 8, with dot lines illustrate a socket cover and an electronic device being connected.

Referring to FIGS. 8 and 9, one lateral side of a receptacle 22 is formed into three-level indent steps 24, 24', 24", ; another lateral side of a receptacle 22 is formed into two-level indent steps 26, 26".

Referring to FIG. 4, two snap studs 28 are disposed on each of two lateral sides of base frame 12, a recess 30 is formed in the middle of a snap stud 28; two holding bulges (projections) 32 are disposed on the top side of base frame 12, each holding bulge 32 has a dome shape groove 34, one holding bulge 32 has a retaining recess 35.

Referring to FIG. 9, a multiplicity of cavities 68 have been formed in the back of base frame 12 and each being located between two receptacles 22 such that, when base frame 12 is formed by injection, the material shrinkage phenomenon can be reduced, thus result in an even and smooth surface with less dimensional deviation. It can also reduce material consumption when making a base frame 12.

Figures 5, 6:
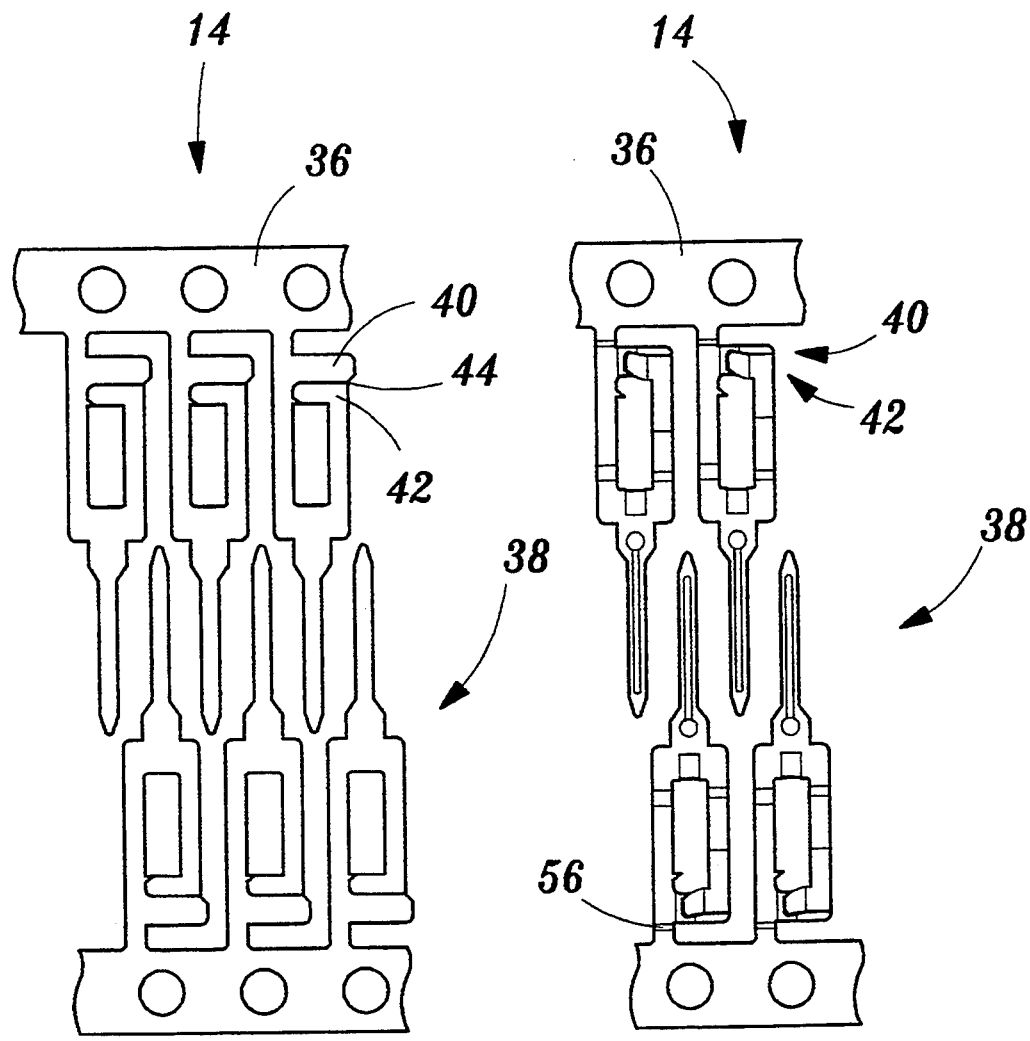
FIG. 5 is a fragmentary plan view of a rack of flattened contact elements of the present invention.
FIG. 6 is a fragmentary plan view of a rack of stamped contact elements of the present invention.

Referring to FIGS. 4, 5, a rack of contact element 14 is formed by a stamping strip 36 and a plurality of contact elements 38.

Referring to FIG. 6, a cut off line 56 is formed during stamping process to allow stamping strip 36 separating from contact elements 38 later on. Two contact element racks 14 are formed in a pair on stamping plate and with contact elements 38 of each rack neighboring each other alternately so to reduce the waste of stamping plate.

Figure 7:
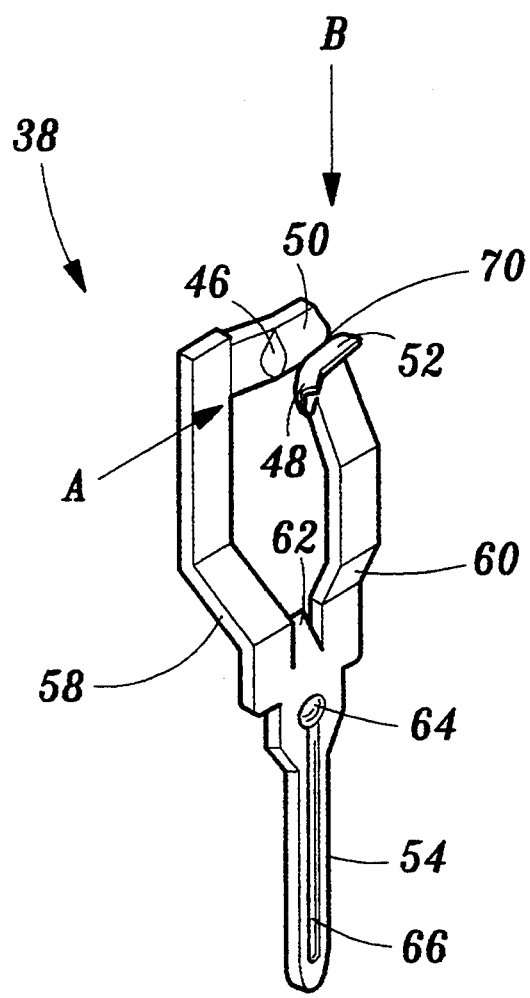
FIG. 7 is a perspective view of a contact element of the present invention.

Referring to FIGS. 5, 7, a contact element 38 has first contact beam 40 and second contact beam 42 with a cut off line 44 being formed between two beams 40,42; a curved surface 46,48 is formed respectively on a lateral side of contact beams 40,42; another curved surface 50, 52 is formed respectively on an upper side of contact beams 40, 42, such that a round pin 74 of an electronic device can be laterally inserted and connect with a contact element 38 (referring to FIG. 8, illustrated by A); or a flat limb 72 of an electronic device can be vertically inserted and connect with a contact element 38 (illustrated by B in FIG. 8).

Referring to FIG. 7, the leg of first contact beam 40 is pressed in one lateral direction and formed an inclined section 58, the leg of second contact beam 42 which is shorter than first contact beam 40 is pressed in another lateral direction and formed with a shorter inclined section 60, such that the contact points on contact beams 40 and 42 will be generally at the same height. A pressing stud 62 is formed at the bifurcation of contact beams 40 and 42 to hold a contact element 38 tightly in a receptacle 22 (also referring to FIG. 9). A contact limb 54 is formed and extended below the bifurcation of contact beams 40 and 42, a convex spot 64 is formed to press against an inside wall of a receptcle 22 so that contact element 38 can be held firmly and vertically in a receptacle 22. An extrusion 66 is formed along the central line of a contact limb 54 and below convex spot 64 to reinforce the mechanical strength of contact limb 54.

Referring to FIG. 4, a contact element rack 14 consisting of a plurality of contact elements 38 and can be installed into a row of socket receptacles 22 on base frame 12 at the same time, with one receptcle 22 holding one contact element 38, then stamping strip 36 can be removed and separated from contact elements 38. Contact element 38 can accept either vertical or lateral connection with an electronic device.

Figure 10:
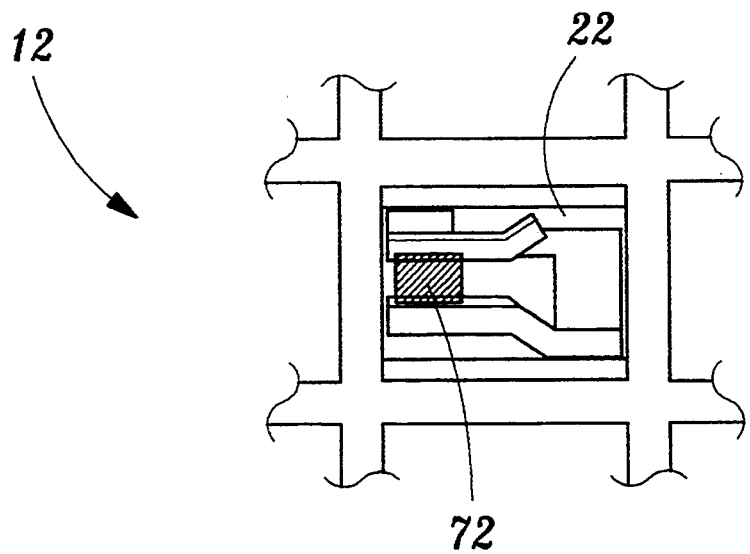
FIG. 10 is a fragmentary top view of a flat limb of an electronic device to be disposed in a connector of the present invention.
Figure 11:
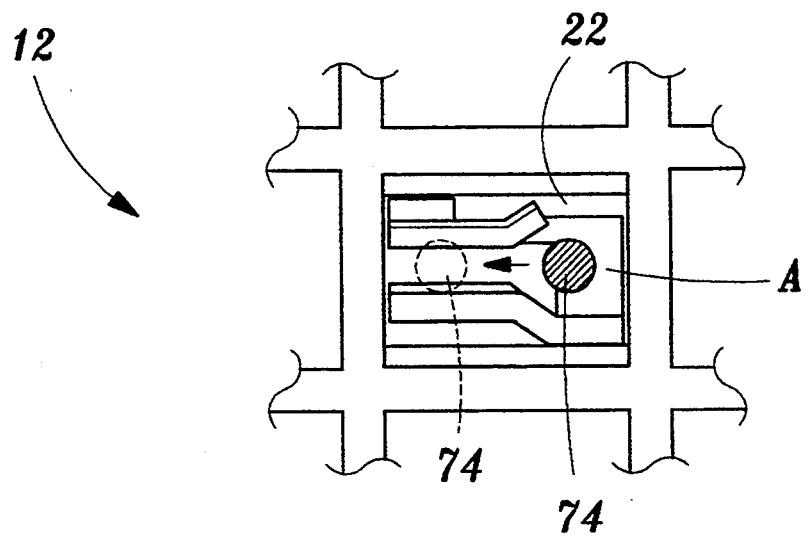
FIG. 11 is a fragmentary top view of a round pin of an electronic device to be disposed in a connector of the present invention, the dotted line illustrates a round pin has been disposed inside of a conncetor.

Referring to FIGS. 8, 10, a flat limb 72 of an electronic device is vertically disposed into a contact element 38 (illustrated by B in FIG. 8). Referring to FIGS. 8, 11, a round pin 74 of an electronic device is laterally disposed into a contact element 38 (illustrated by A in FIG. 8).

Figure 12:
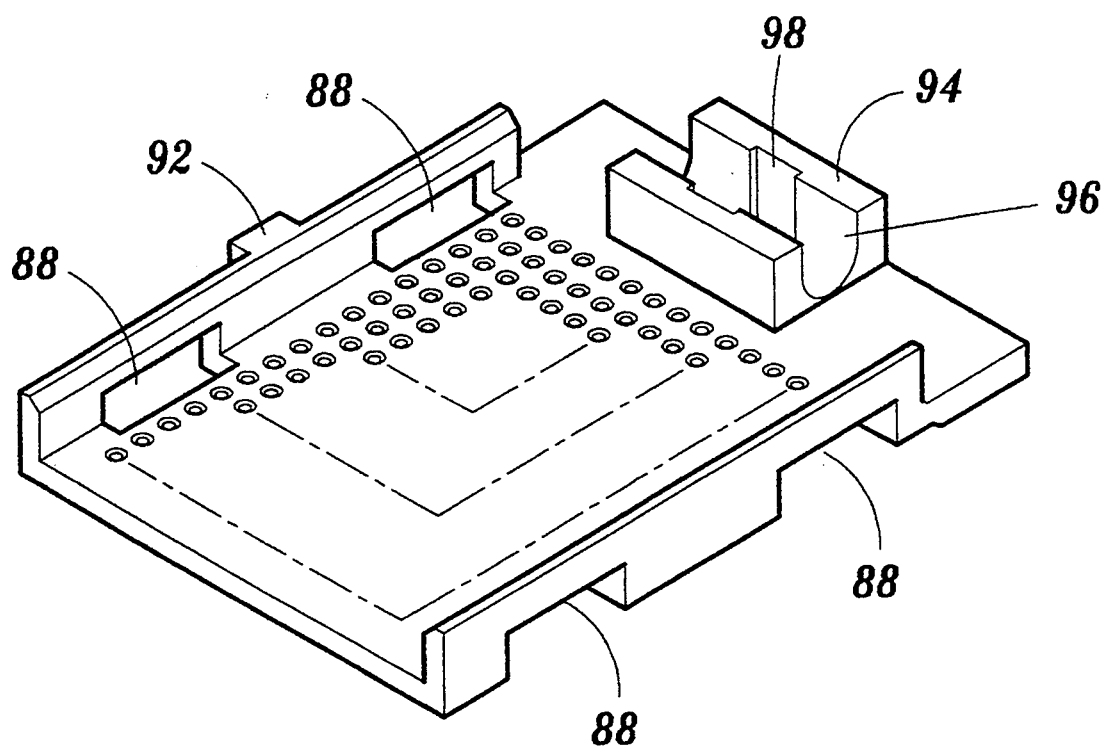
FIG. 12 is a bottom view of a movable socket cover of the present invention.
Figure 13:
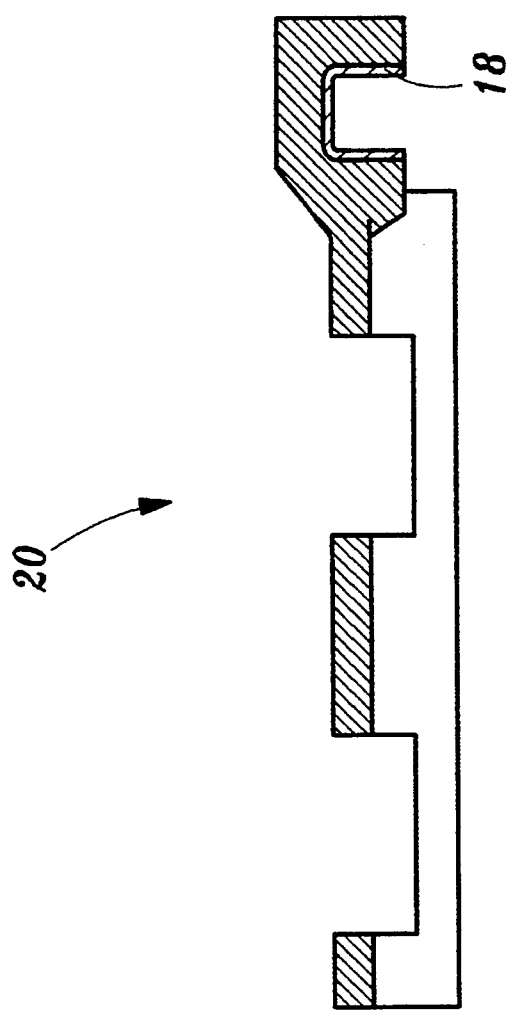
FIG. 13 is a section view of a movable socket cover of the present invention, it also illustrates a cross section of a bushing (18).

Referring to FIGS. 4, 12, 13 for an engaging mechanism, two holding bulges 32 are formed at one end of base frame 12 each having a dome shape groove 34 to house a shaft 76 of fan operating lever 16; operating lever 16 has a handle 78 being formed as an integral part of shaft 76 and is perpendicular to shaft 76; an ecentric shaft 80 is formed in the middle portion of shaft 76 and a retaining stud 82 is formed on shaft 76 nearby of handle 78 and can engage with a retaining recess 35 on a dome shape groove 34, such that operating level 16 will be prevented from axial movement when shaft 76 is turning in dome shape groove 34.

There is a plurality of guiding holes 86 being formed on socket cover 20, and each guiding hole 86 matches a corresponding receptacle 22 on base frame 12 and allows a connecting pin or limb 110 of an electronic device to pass through. Two cutaway openings 88 are formed on each of lateral sides of socket cover 20 and can engage with snap studs 28 formed on the lateral sides of base frame 12, such that socket cover 20 can be mounted on base frame 12 and be engaged closely. A pair of holding studs 90 and 92 is formed on a lateral side of socket cover 20 and between openings 88 to hold handle 78 and making socket cover 20 engaging tightly with base frame 12 to facilitade the installation of contact pins or limbs of an electronic device into connector socket or the testing thereafter.

A metal bushing 18 having been formed in a reversed "U" shape with locking studs 84 on lateral sides is disposed and fixed in a recess 98 of a dome shape groove 96 in a holding bulge 96 which is formed under one end of socket cover 20. Ecentric shaft 80 is housed in bushing 18, such that when handle 78 being moved up or down, socket cover 20 will be moved in rear or front direction and in parallel with the surface of base frame 12, thus to facilitate the matching and alignment of guiding holes 86 on socket cover 20 with the corresponding receptacles 22 on base frame 12; metal bushing 18 is to reduce friction and wearing caused by the motion of ecentric shaft 80.

Figure 14:
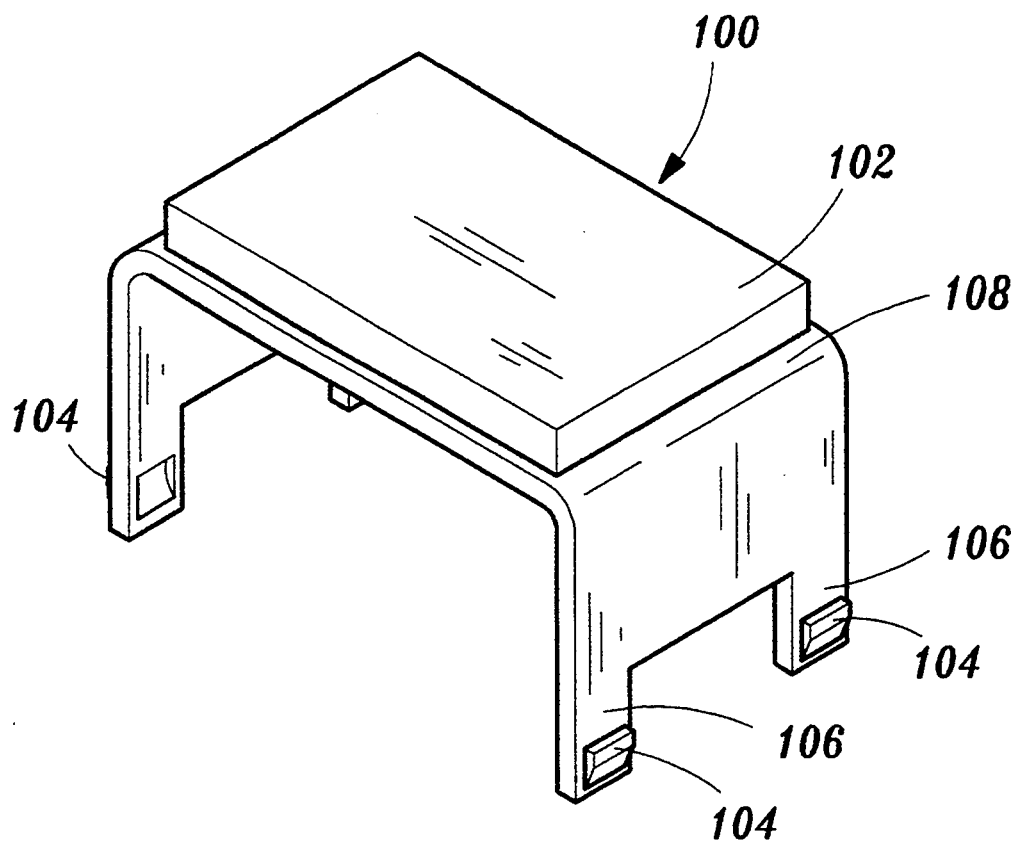
FIG. 14 is a perspective view of a disengaging means of the present invention.

Referring to FIG. 14, a disengaging means 100 is formed in a reversed "U" shape with two flanges 106 being formed on each lateral side, a tapered stud 104 is formed on each flange 106. Now referring to FIG. 4, when disengaging means 100 is pressed against a socket cover 20, flanges 106 pass through openings 88 and force into recesses 30 of base frame 12, and subsequently taper studs 104 push lateral sides of socket cover 20 outward, thus free socket cover 20 from snap studs 28 and allowing socket cover 20 to be separated from base frame 12. A plate 102 is disposed on top side 108 of disengaging means 100 to reinforce its stiffness.

It is to be understood that the descriptions and preferred embodiments set forth above are only to serve for illutrative purpose, and do not intent to limit the scope of the present invention. Various changes and modifications may be made without departing from the scope of the present invention. Accordingly, the specific scope of the present invention is defined only by the following claims which are further examplary of the present invention.

What is claimed is:

1. A connector socket comprising:
    a base frame having a plurality of receptacles therein, each receptacle having three-level indent steps on one lateral side and two-level indent steps on another lateral side, said base frame further having two snap studs on each of two lateral sides thereof, said snap studs each having a recess formed in the middle;
    a plurality of contact elements including a stamping strip, each said contact element having first and second contact beams, said first contact beam being above said second contact beam and separable from said second contact beam, said first contact beam having a leg formed as an inclined section, said second contact beam also having a leg forming an inclined section but shorter and in the opposite direction of that of said first contact beam, thus making contact points on said first and second contact beams being generally at the same height, an upper side and a lateral side of said first and second contact beams having a curved surface to allow a limb of an electronic device to be vertically or laterally inserted therebetween;
    a metal bushing having a reversed "U" shape cross section and having a plurality of locking studs on its lateral sides; and
    a removable socket cover having two cutaway openings on each of its lateral sides, said socket cover having a holding projection formed under one end, the holding projection having a recess formed therein to house said metal bushing.

2. The connector socket as claimed in claim 1 wherein:
    said metal bushing is fixable in said holding projection of said socket cover.

3. The connector socket as claimed in claim 1 wherein:
    the socket further comprises a disengaging means, said disengaging means including flanges with tapered studs thereon, said tapered studs being inserted into said cutaway openings on said removable socket cover to remove said cover from said base frame.

* * * * *